United States Patent
Chopin et al.

(10) Patent No.: US 8,836,110 B2
(45) Date of Patent: Sep. 16, 2014

(54) HEAT SPREADER FOR USE WITHIN A PACKAGED SEMICONDUCTOR DEVICE

(75) Inventors: Sheila F. Chopin, Round Rock, TX (US); Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/600,364

(22) Filed: Aug. 31, 2012

(65) Prior Publication Data

US 2014/0061894 A1  Mar. 6, 2014

(51) Int. Cl.
*H01L 23/34* (2006.01)
*F28F 7/00* (2006.01)
*H01L 21/56* (2006.01)

(52) U.S. Cl.
USPC .............. 257/712; 257/E23.08; 257/E21.502; 257/E23.09; 257/E23.101; 257/E23.104; 257/706; 257/707; 257/713; 257/787; 257/717; 257/720; 361/704; 165/185

(58) Field of Classification Search
USPC ............. 257/E23.09, E23.101, E23.104, 706, 257/707, 712, 713, 787, 717, 720; 361/704; 165/185; 438/127
See application file for complete search history.

(56) References Cited

U.S. PATENT DOCUMENTS

| | | | | |
|---|---|---|---|---|
| 4,144,636 A * | 3/1979 | Burkhardt et al. | | 438/49 |
| 5,166,772 A | 11/1992 | Soldner et al. | | |
| 5,384,687 A * | 1/1995 | Sano | | 361/689 |
| 5,723,904 A * | 3/1998 | Shiga | | 257/698 |
| 6,051,888 A * | 4/2000 | Dahl | | 257/778 |
| 6,229,702 B1 * | 5/2001 | Tao et al. | | 361/704 |
| 6,232,652 B1 * | 5/2001 | Matsushima | | 257/667 |
| 6,552,428 B1 * | 4/2003 | Huang et al. | | 257/706 |
| 6,716,676 B2 * | 4/2004 | Chen et al. | | 438/122 |
| 6,970,358 B2 * | 11/2005 | Harris | | 361/719 |
| 7,122,911 B2 * | 10/2006 | Yang | | 257/796 |
| 7,154,053 B2 * | 12/2006 | Hsu | | 174/564 |
| 7,190,066 B2 * | 3/2007 | Huang et al. | | 257/704 |
| 7,196,403 B2 | 3/2007 | Karim | | |
| 7,230,831 B2 * | 6/2007 | Luckner et al. | | 361/719 |
| 7,235,889 B2 | 6/2007 | Othieno et al. | | |
| 7,303,005 B2 | 12/2007 | Reis et al. | | |
| 7,993,978 B2 | 8/2011 | Sato | | |
| 8,012,799 B1 | 9/2011 | Ibrahim et al. | | |
| 8,018,072 B1 | 9/2011 | Miks et al. | | |
| 2006/0170094 A1 * | 8/2006 | Subramanian et al. | | 257/706 |
| 2009/0039483 A1 * | 2/2009 | Chang et al. | | 257/675 |
| 2009/0065882 A1 * | 3/2009 | Shirasaka | | 257/415 |
| 2011/0012704 A1 * | 1/2011 | Kimura et al. | | 337/168 |
| 2011/0045616 A1 * | 2/2011 | Miyashita et al. | | 438/17 |
| 2012/0182694 A1 * | 7/2012 | Lin et al. | | 361/715 |
| 2012/0319264 A1 * | 12/2012 | Fukuda et al. | | 257/690 |
| 2013/0313698 A1 * | 11/2013 | Chen et al. | | 257/690 |

\* cited by examiner

*Primary Examiner* — Alexander Oscar Williams

(74) *Attorney, Agent, or Firm* — Joanna G. Chiu; Mary Jo Bertani

(57) ABSTRACT

A packaged semiconductor device includes a package substrate, an integrated circuit (IC) die mounted on the package substrate, and a heat spreader mounted on the package substrate. The heat spreader surrounds at least a portion of the IC die and includes a lid with a plurality of openings. An inner portion of the heat spreader includes a plurality of thermally conductive protrusions adjacent the die.

21 Claims, 3 Drawing Sheets

HEAT SPREADER FOR USE WITHIN A PACKAGED SEMICONDUCTOR DEVICE

BACKGROUND

1. Field

This disclosure relates generally to semiconductor packaging, and more specifically, to a heat spreader for use with a packaged semiconductor device.

2. Related Art

During operation, semiconductor devices generate heat. If inadequately removed, the heat generated by the semiconductor device may cause the device to fail or to perform erratically. Therefore, heat spreaders are commonly used to dissipate the heat produced by semiconductor devices. As semiconductor die are designed with ever increasing functionality and speed requirements, it is desirable to find ways to reduce/remove heat generated by the device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Many molding processes, such as the compression molding process or pin-gate molding process (i.e. center gate molding process), use granular powder or liquid to encapsulate the semiconductor die. However, the traditional heat spreader designs, which utilizes solid metal planes or a single top surface hole, block the compound flow during such molding processes, thus preventing proper encapsulation. Therefore, in one embodiment, a number of openings are formed in the heat spreader such that powder or liquid can enter the cavity created by the heat spreader. Furthermore, heat conducting protrusions which extend into the die cavity from the tops and sides are formed in order to enhance the heat spreading capability. In this manner, molding processes which use granular or liquid mold compound may be used for molding semiconductor die with a heat spreader. By using the granular powder or liquid, as in compression molding, the amount of mold compound is reduced, thereby reducing the encapsulant thickness and reducing wire sway. Furthermore, in one embodiment, a top surface of the heat spreader is recessed, so as to form a raised lip around the perimeter of the top surface. This ensures a uniform thin layer of encapsulant on the top surface of the packaged semiconductor device which may be used for marking purposes and which does not impede thermal performance.

Figure 1:
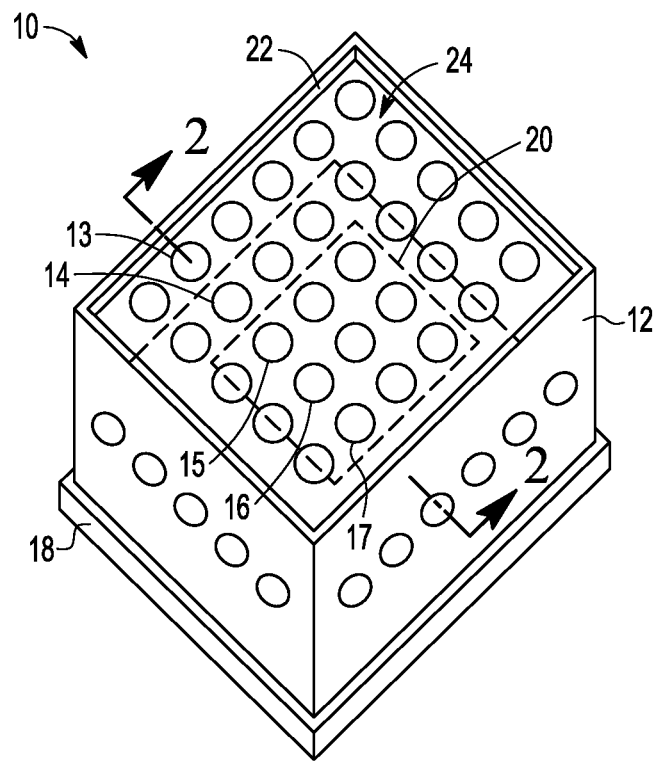
FIG. 1 illustrates a perspective view of a packaged semiconductor device in accordance with one embodiment of the present disclosure.

FIG. 1 illustrates a perspective view of a packaged semiconductor device 10 at a stage in processing in accordance with an embodiment of the present disclosure. Device 10 includes a package substrate 18, which may be, for example, a lead frame or a laminate substrate. Furthermore, note that semiconductor device 10 may be a portion of an array of devices being formed rather than a single device. For example, a lead frame or laminate substrate may include an array of N×M devices, where each device may be similar to device 10. A semiconductor die 20 is mounted on package substrate 18 (as illustrated by the dotted line). Device 10 also includes electrical connections (not shown in FIG. 1 so as not to complicate the drawings) between die 20 and package substrate 18. For example, the electrical connections may be wire bonds formed from a top surface of die 20 to a top surface of package substrate 18.

A heat spreader 12 is attached to package substrate 18 such that heat spreader 12 covers die 20 and the electrical connections between die 20 and package substrate 18. Heat spreader 12 is formed of a thermally conductive material. In one embodiment, heat spreader 12 is a thermally conductive material, such as metal. In one embodiment, heat spreader 12 is copper. Heat spreader 12 surrounds at least a portion of die 20. In the illustrated embodiment, the vertical sidewalls of heat spreader 12 fully surround die 20, and heat spreader 12 includes a top surface, or lid, which covers die 20 and is in contact with the vertical sidewalls. As also illustrated in FIG. 1, the top surface of heat spreader 12 is recessed such that a raised lip 22 is formed at the perimeter of the top surface of heat spreader 12. In this manner, the top surface of heat spreader 12 is recessed with respect to the top edges of the vertical sidewalls. As will be described below, raised lip 22, which may also be referred to as a metal dam, provides for a thin planar mold compound finish across a top surface of molded packaged device 10. Also, note that heat spreader 12 forms a cavity or inner portion between package substrate 18 and heat spreader 12. This cavity or inner portion includes die 20, the electrical connections (such as the wire bonds), and will also include the mold compound.

In the illustrated embodiment, heat spreader 12 includes a plurality of openings in a top surface (i.e. the lid), such as exemplary openings 13-17, and a plurality of openings in the sidewalls. The openings can be any shape. In one embodiment, the openings are formed in a regular array on the top surface. In one embodiment, the openings cover at most 50% of the surface area of the top surface. In this manner, there are sufficient openings through which the molding compound may enter the cavity formed between package substrate 18 and heat spreader 12 while still maintaining sufficient heat dissipation. Furthermore, heat spreader 12 includes a plurality of protrusions which extend from heat spreader 12 into the cavity toward dies 20 (note that these are not visible in the perspective view of FIG. 1). As will be described below, these protrusions allow for enhanced heat dissipation by bringing the metal of heat spreader 12 closer to die 20 and by increasing the surface area of heat spreader 12 which faces die 20. In one embodiment, the protrusions cover 50% of the surface facing die 20. The protrusions may be located on an inner portion of the lid and may also be located on the inner sidewalls of heat spreader 12.

Semiconductor die 20 can be any type of device or integrated circuit, and may also be referred to as an integrated circuit (IC) die. For example, die 20 can be networking integrated circuit or perform any other type of functions. Furthermore, semiconductor die 20 may include any number of die or integrated circuits. They may be formed in a stacked configuration on package substrate 18 and covered by heat spreader 12 or may be adjacent each other on package substrate 18 and covered by heat spreader 12.

Figure 2:
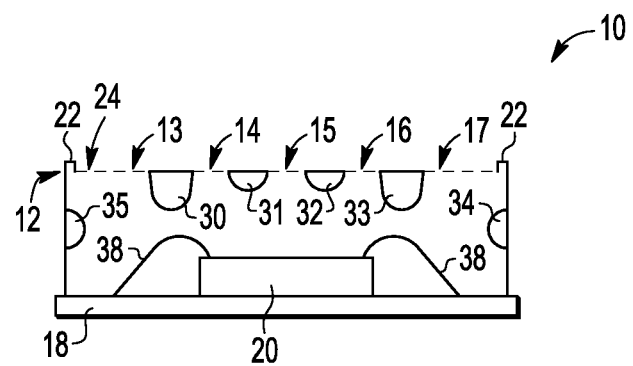
FIG. 2 illustrates a cross sectional view of the packaged semiconductor device of FIG. 1 in accordance with one embodiment of the present disclosure.

FIG. 2 illustrates a cross sectional view of packaged semiconductor device 10 of FIG. 1. The cross section view of FIG. 2 illustrates the protrusions, such as exemplary protrusions 30-35, located on the inner surfaces of heat spreader 12, protruding in from heat spreader 12 towards die 20. That is, the protrusions are included in the inner portion of heat spreader 12. In the exemplary cross section of FIG. 2, each of protrusions 30-33 is located between two adjacent openings of openings 13-17. In one embodiment, each of the protrusions, such as protrusions 30-35, extend a same distance into the cavity towards die 20. That is, they may extend to a common plane. For example, in one embodiment, this distance may be half the distance between the inner surface of the top of spreader 12 and a top surface of die 20. In other embodiments, the protrusions may vary in size and may extend to different planes. For example, as illustrated in FIG. 2, protrusions which are not located directly over die 20, such as protrusions 30 and 33, may extend further into the cavity than protrusions 31 and 32. In one embodiment, the protrusions are of a thermally conductive material, such as, for example, metal. In one embodiment, they are formed of the same thermally conductive material or metal as heat spreader 12. Also illustrated in FIG. 2 are exemplary wire bonds 38 which form part of the electrical connections between die 20 and package substrate 18.

Although heat spreader 12 is illustrated as rectangular in shape around die 20 (when viewed from the top down), heat spreader 12 may be of any shape. For example, it may be a rounded shape, such as circular, when viewed from the top down. Also, in one embodiment, the holes and/or protrusions on the sidewalls of spreader 12 may not be present. Furthermore, the protrusions are illustrated as semicircular in shape, but may also have other shapes. In one embodiment, the openings and protrusions of heat spreader 12 may be formed on a flat metal sheet, which is subsequently formed into a heat spreader.

Figure 3:
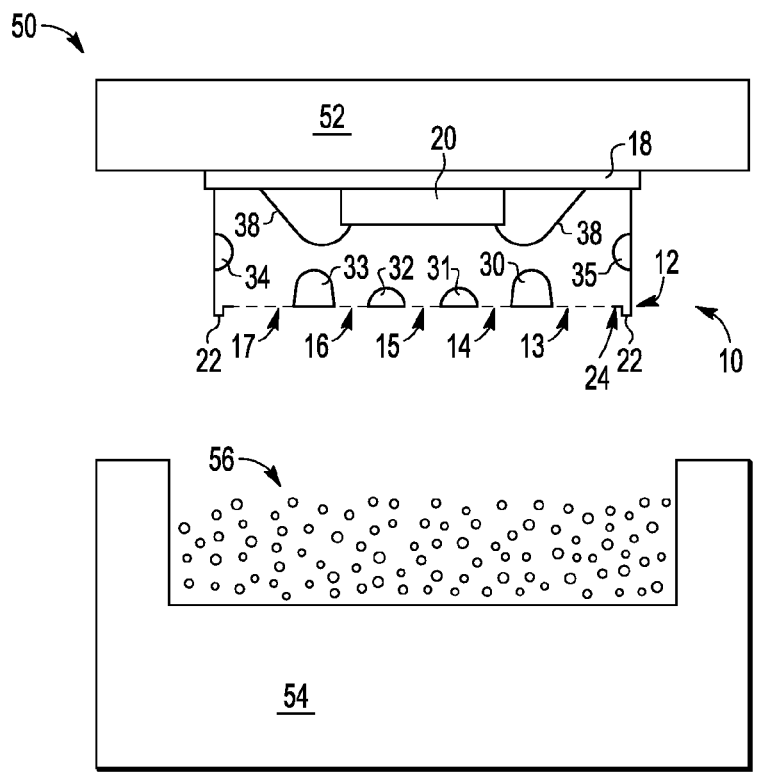
FIG. 3 illustrates a cross sectional view of the packaged semiconductor device of FIG. 2 within a compression molding tool in accordance with one embodiment of the present disclosure.

FIG. 3 illustrates a cross sectional view of device 10 within a compression molding tool 50 in accordance with one embodiment. Molding tool 50 includes a top portion 52 (also referred to as a top compression mold chase), to which device 10 is mounted, and a bottom portion 54 (also referred to as a bottom compression mold chase) which includes a cavity containing a granular molding powder 56 (which may also be referred to as a powdered encapsulant. Bottom portion 54 of molding tool 50 is heated, such that powder 56 becomes liquid. (Alternatively, powder 56 may be a liquid in its original form.)

Figure 4:
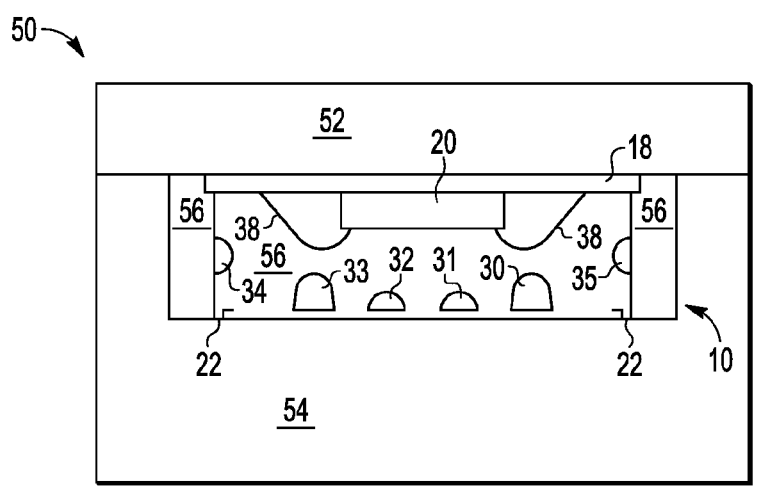
FIG. 4 illustrates a cross sectional view of the packaged semiconductor device and compression molding tool of FIG. 3 at a subsequent stage in processing, in accordance with one embodiment of the present disclosure.

FIG. 4 illustrates a cross sectional view of device 10 within compression molding tool 20 at a subsequent stage in processing. Top portion 52 and bottom portion 54 are brought together such that they contact each other. In doing so, device 10 is immersed into liquid 56 (corresponding to the melted powder) so that liquid 56 flows through the openings of heat spreader 12 so as to fill the cavity between package substrate 18 and heat spreader 12, thus surrounding die 20 and wire bonds 38. In this manner, die 20 and wire bonds 38 are encapsulated by the molding compound. The depth of the cavity in bottom portion 54 can be controlled such that the top surfaces of lip 22 contact the bottom of the cavity. In this manner, molding compound 56 does not form on the top surfaces of lip 22. After immersing device 10 into liquid 56, liquid 56 is cured.

Note that, in one embodiment, an array of devices, each with a corresponding heat spreader, may be placed in compression tool 50 simultaneously. After removal from the tool, the array may be singulated, such as by punch through or by sawing.

Figure 5:
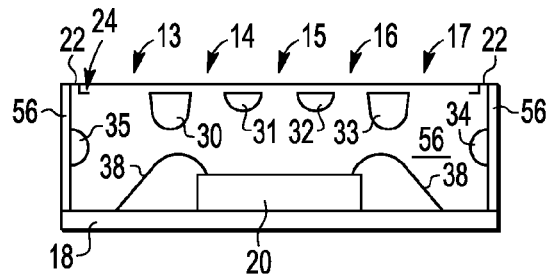
FIG. 5 illustrates a cross sectional view of the packaged semiconductor device of FIG. 4 after compression molding, in accordance with one embodiment of the present disclosure.

FIG. 5 illustrates a cross sectional view of device 10 after removal from compression tool 50 and after singulation. As illustrated in FIG. 5, the top surface of lip 22 remains exposed, and molding compound 56 is formed surrounding die 20 and formed in a thin uniform layer over the top surface of heat spreader 12. Also, thin layers of molding compound 56 are formed on the sidewalls of heat spreader 12. However, due to the oxidation of the sidewalls prior to entering molding compound tool 50, only a thin layer of molding compound 56 is formed on the sidewalls.

Figure 6:
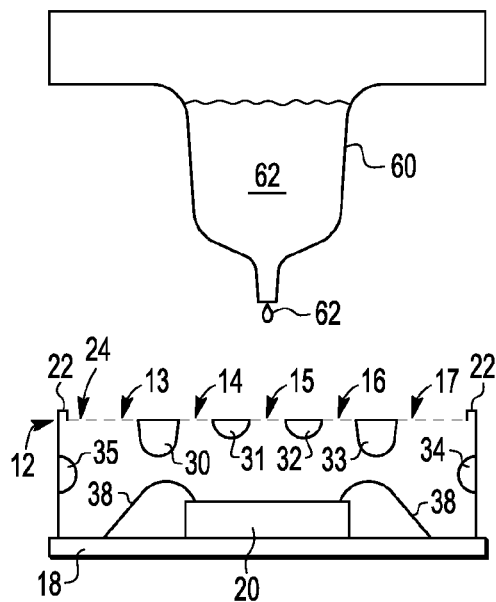
FIG. 6 illustrates a cross sectional view of the packaged semiconductor device of FIG. 2 within a pin-gate molding tool in accordance with one embodiment of the present disclosure.

FIG. 6 illustrates a cross sectional view of device 10 within a pin-gate molding tool 60 (also referred to as a center-gate molding tool) in accordance with one embodiment. Molding tool 60 includes molding compound liquid 62 (also referred to as liquid encapsulant) and expels it from a nozzle onto device 10. In one embodiment, the nozzle is moved over the surface of device 10 as liquid 62 is expelled. Therefore, liquid 62 is deposited over the lid of heat spreader 12 so that liquid 62 flows through the openings in the lid into the cavity between package substrate 18 and heat spreader 12. Note that in this embodiment, heat spreader 12 may not include any openings in the sidewalls.

As with molding compression tool 50, device 10 may be part of an array of devices, each with a corresponding heat spreader, and which may be placed in pin-gate molding tool 60 simultaneously. After removal from the tool, the array may be singulated, such as by punch through or by sawing.

Figure 7:
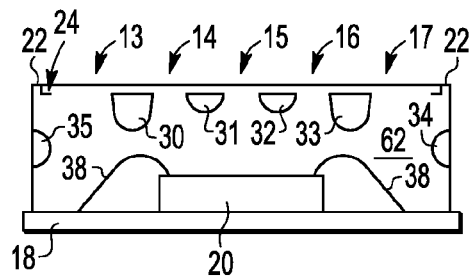
FIG. 7 illustrates a cross sectional view of the packaged semiconductor device of FIG. 6 after encapsulation, in accordance with one embodiment of the present disclosure.

FIG. 7 illustrates a cross sectional view of device 10 in which mold compound 62 (corresponding to liquid 62) is formed within the cavity between package substrate 18 and heat spreader 12, thus surrounding die 20 and wire bonds 38. Sufficient mold compound 62 is dispensed so that it flows over the top surface of heat spreader 12. Mold compound 62 is contained over the top surface of heat spreader 12 by lip 22. In this manner, mold compound 62 is formed within an inner perimeter of lip 22. Therefore, note that the top surface of raised lip 22 remains exposed.

Therefore, by now it can be appreciated how a heat spreader with a plurality of openings and a plurality of protrusions can be utilized to allow for the use of a liquid or powder molding compound (which enter through the openings) while maintaining enhanced heat dissipation abilities. Furthermore, the raised lip of the heat spread may enable a high quality top surface marking on the package.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, die 20, package substrate 18 and wire bonds 38 can be replaced with any type of device, electrical connections, and substrate, as needed, which are at least partially covered by a heat sink such as heat sink 12. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a packaged semiconductor device, including a package substrate; an integrated circuit (IC) die mounted on the package substrate; and a heat spreader mounted on the package substrate, wherein the heat spreader surrounds at least a portion of the IC die, the heat spreader includes a lid with a plurality of openings, and an inner portion of the heat spreader includes a plurality of thermally conductive protrusions adjacent the die. Item 2 includes the device of item 1, wherein a perimeter of the lid includes a raised lip. Item 3 includes the device of item 1, and further includes a plurality of openings in a sidewall of the heat spreader. Item 4 includes the device of item 1, wherein the openings allow granular powder that forms mold compound when heated to enter the inner portion of the heat spreader. Item 5 includes the device of item 1, wherein the openings allow liquid that forms mold compound to enter the inner portion of the heat spreader. Item 6 includes the device of item 1, wherein a subset of the protrusions are a different size than a remaining portion of the protrusions. Item 7 includes the device of item 1, wherein the protrusions are located between the openings. Item 8 includes the device of item 2, and further includes a mold compound over an outer portion of the lid and within the raised lip of the lid.

Item 9 includes a heat spreader for a semiconductor device, including a heat spreader including a lid having a plurality of openings; at least two sidewalls configured to extend from the lid; and an inner portion of the lid includes a plurality of thermally conductive protrusions. Item 10 includes the heat spreader of item 9, wherein a perimeter of the lid includes a raised lip. Item 11 includes the heat spreader of item 9, and further includes at least one of a group consisting of: a plurality of openings in the sidewalls of the heat spreader, and a plurality of thermally conductive protrusions on the sidewalls. Item 12 includes the heat spreader of item 9, wherein the openings cover fifty percent or less of an area of the heat spreader. Item 13 includes the heat spreader of item 9, wherein the openings allow at least one of a group consisting of: melted granular powder that forms mold compound when heated and a liquid that forms mold compound, to enter an inner portion of the heat spreader. Item 14 includes the heat spreader of item 9, wherein a subset of the protrusions are a different size than a remaining portion of the protrusions. Item 15 includes the heat spreader of item 9, wherein the protrusions are located between the openings.

Item 16 includes a method including attaching a heat spreader over a semiconductor die to form a packaged semiconductor device, wherein the die is mounted on a substrate and the heat spreader includes a lid having a plurality of openings; at least two sidewalls adjacent to the lid, the sidewalls are configured to spatially separate the lid from the semiconductor die; an inner portion of the lid includes a plurality of thermally conductive protrusions. Item 17 includes the method of item 16, and further includes filling a bottom compression mold chase with a granular encapsulant; heating the encapsulant to form a liquid; immersing the packaged semiconductor device into the liquid so that the liquid flows through the openings to encapsulate the die; and curing the liquid. Item 18 includes the method of item 16, and further includes depositing a liquid encapsulant over the lid so that the liquid encapsulant flows through the openings to encapsulate the die. Item 19 includes the method of item 16, wherein the heat spreader includes a plurality of thermally conductive protrusions on an inner portion of the sidewalls. Item 20 includes the method of item 16, wherein the lid includes a raised lip, and the method further includes forming mold compound over the lid within an inner perimeter of the raised lip.

What is claimed is:
1. A packaged semiconductor device, comprising:
a package substrate;
an integrated circuit (IC) die mounted on the package substrate; and
a heat spreader mounted on the package substrate, wherein
the heat spreader surrounds at least a portion of the IC die,
the heat spreader includes a lid with a plurality of openings which extend entirely through the lid, and
an inner portion of the heat spreader includes a plurality of thermally conductive protrusions adjacent the die,
wherein the openings allow granular powder that forms mold compound when heated to enter the inner portion of the heat spreader.

2. The device of claim 1, wherein a perimeter of the lid includes a raised lip.

3. The device of claim 1, further comprising:
a plurality of openings in a sidewall of the heat spreader.

4. A packaged semiconductor device, comprising:
a package substrate;
an integrated circuit (IC) die mounted on the package substrate; and
a heat spreader mounted on the package substrate, wherein
the heat spreader surrounds at least a portion of the IC die,
the heat spreader includes a lid with a plurality of openings which extend entirely through the lid, and
an inner portion of the heat spreader includes a plurality of thermally conductive protrusions adjacent the die, wherein:
a subset of the protrusions are a different size than a remaining portion of the protrusions.

5. The device of claim 4, wherein the openings allow liquid that forms mold compound to enter the inner portion of the heat spreader.

6. The device of claim 1, wherein the protrusions are located between the openings.

7. The device of claim 2, further comprising:
a mold compound over an outer portion of the lid and within the raised lip of the lid.

8. A heat spreader for a semiconductor device, comprising:
a heat spreader including
   a lid having a plurality of openings which extend entirely through the lid;
   at least two sidewalls configured to extend from the lid;
   an inner portion of the lid includes a plurality of thermally conductive protrusions, wherein the protrusions are located between the openings.

9. The heat spreader of claim 8, wherein a perimeter of the lid includes a raised lip.

10. The heat spreader of claim 8, further comprising at least one of a group consisting of:
   a plurality of openings in the sidewalls of the heat spreader, and
   a plurality of thermally conductive protrusions on the sidewalls.

11. The heat spreader of claim 8, wherein the openings cover fifty percent or less of an area of the heat spreader.

12. The heat spreader of claim 8, wherein the openings allow at least one of a group consisting of: melted granular powder that forms mold compound when heated and a liquid that forms mold compound, to enter an inner portion of the heat spreader.

13. A heat spreader for a semiconductor device, comprising:
a heat spreader including
   a lid having a plurality of openings which extend entirely through the lid;
   at least two sidewalls configured to extend from the lid;
   an inner portion of the lid includes a plurality of thermally conductive protrusions, wherein: a subset of the protrusions are a different size than a remaining portion of the protrusions.

14. The device of claim 4, wherein a perimeter of the lid includes a raised lip.

15. The device of claim 4, further comprising:
a plurality of openings in a sidewall of the heat spreader.

16. The device of claim 4, wherein the protrusions are located between the openings.

17. The device of claim 14, further comprising:
a mold compound over an outer portion of the lid and within the raised lip of the lid.

18. The heat spreader of claim 13, wherein a perimeter of the lid includes a raised lip.

19. The heat spreader of claim 13, further comprising at least one of a group consisting of:
   a plurality of openings in the sidewalls of the heat spreader, and
   a plurality of thermally conductive protrusions on the sidewalls.

20. The heat spreader of claim 13, wherein the openings cover fifty percent or less of an area of the heat spreader.

21. The heat spreader of claim 13, wherein the openings allow at least one of a group consisting of: melted granular powder that forms mold compound when heated and a liquid that forms mold compound, to enter an inner portion of the heat spreader.

* * * * *